(12) United States Patent
Bao et al.

(10) Patent No.: US 11,031,301 B2
(45) Date of Patent: Jun. 8, 2021

(54) GATE FORMATION SCHEME FOR N-TYPE AND P-TYPE TRANSISTORS HAVING SEPARATELY TUNED THRESHOLD VOLTAGES

(71) Applicant: International Business Machines Corporation, Armonk, NY (US)

(72) Inventors: Ruqiang Bao, Niskayuna, NY (US); Unoh Kwon, Clifton Park, NJ (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/691,803

(22) Filed: Nov. 22, 2019

(65) Prior Publication Data

US 2020/0118889 A1 Apr. 16, 2020

Related U.S. Application Data

(62) Division of application No. 16/157,325, filed on Oct. 11, 2018.

(51) Int. Cl.
*H01L 21/8238* (2006.01)
*H01L 29/49* (2006.01)
(Continued)

(52) U.S. Cl.
CPC ........... *H01L 21/823842* (2013.01); *H01L 21/28088* (2013.01); *H01L 21/823821* (2013.01); *H01L 27/0924* (2013.01); *H01L 29/4966* (2013.01)

(58) Field of Classification Search
CPC ..... H01L 21/823842; H01L 21/823821; H01L 27/0924
See application file for complete search history.

(56) References Cited

U.S. PATENT DOCUMENTS 7,855,105 B1  12/2010  Jagannathan et al.
8,669,167 B1   3/2014  Chang et al.
(Continued)

FOREIGN PATENT DOCUMENTS

CN         106952874 A      7/2017

OTHER PUBLICATIONS

Bao et al., "Gate Formation Scheme for N-Type and P-Type Transistors Having Separately Tuned Threshold Voltages," U.S. Appl. No. 16/157,325, filed Oct. 11, 2018.
(Continued)

*Primary Examiner* — Bac H Au
(74) *Attorney, Agent, or Firm* — Cantor Colburn LLP; Douglas Pearson

(57) ABSTRACT

Embodiments of the invention include a wafer having gate stacks over channel fins. The wafer includes a first channel fin in an n-type region of a substrate, a second channel fin in a p-type region of the substrate, and a gate dielectric over the substrate and the first and second channel fins. A work function metal stack is over the gate dielectric, the first channel fin in the n-type region, and the second channel fin in the p-type region. The work function metal stack over the gate dielectric and the first channel fin in the n-type region forms a first work function metal stack. The work function metal stack over the gate dielectric and the second fin in the p-type region forms a second work function metal stack. The first work function metal stack includes a shared layer of work function metal shared with the second work function metal stack.

4 Claims, 19 Drawing Sheets

(51) Int. Cl.
*H01L 27/092* (2006.01)
*H01L 21/28* (2006.01)

(56) References Cited

U.S. PATENT DOCUMENTS

| | | |
|---|---|---|
| 8,878,298 B2 | 11/2014 | Chang et al. |
| 9,455,201 B2 | 9/2016 | Joshi et al. |
| 9,553,090 B2 | 1/2017 | Chang et al. |
| 9,627,500 B2 | 4/2017 | Kim |
| 9,837,406 B1 | 12/2017 | Balakrishnan et al. |
| 9,847,402 B2 | 12/2017 | Lin et al. |
| 10,002,791 B1 | 6/2018 | Bao et al. |
| 10,074,574 B2 | 9/2018 | Bao et al. |
| 10,340,192 B2 | 7/2019 | Jangjian et al. |
| 2011/0221889 A1 | 9/2011 | Knox et al. |
| 2015/0262828 A1 | 9/2015 | Brand et al. |
| 2016/0086860 A1 | 3/2016 | Kannan et al. |
| 2016/0365347 A1 | 12/2016 | Bao et al. |
| 2017/0207219 A1 | 7/2017 | Bao et al. |
| 2017/0221889 A1 | 8/2017 | Dasgupta et al. |
| 2017/0358655 A1 | 12/2017 | Bao et al. |
| 2018/0019242 A1 | 1/2018 | Liao et al. |
| 2018/0151451 A1 | 5/2018 | Li |
| 2018/0261514 A1 | 9/2018 | Xie et al. |
| 2019/0157165 A1 | 5/2019 | Kim et al. |

OTHER PUBLICATIONS

List of IBM Patents or Patent Applications Treated as Related; Date Filed: Nov. 22, 2019, 2 pages.

GATE FORMATION SCHEME FOR N-TYPE AND P-TYPE TRANSISTORS HAVING SEPARATELY TUNED THRESHOLD VOLTAGES

DOMESTIC PRIORITY

This application is a divisional of U.S. application Ser. No. 16/157,325, filed Oct. 11, 2018, the contents of which are incorporated by reference herein in its entirety.

BACKGROUND

The present invention relates in general to fabrication methods and resulting structures for semiconductor devices. More specifically, the present invention relates to fabrication methods and resulting structures for gates of n-type and p-type transistors having separately tuned threshold voltages.

Typical semiconductor devices are formed using active regions of a wafer. The active regions are defined by isolation regions used to separate and electrically isolate adjacent semiconductor devices. For example, in an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

A transistor is essentially a switch. When a voltage greater than a threshold (Vt) is applied to transistor gate, the transistor/switch is turned on, and current flows from the transistor's source through the channel to the drain. When the voltage at the gate is less than Vt, the switch is off, and current does not flow through the transistor. As power and performance optimization have become increasingly important, the number of different Vt levels available on a process have proliferated. Multiple Vt levels allow designers to select the best option for each section of a design by trading-off power and performance.

SUMMARY

Embodiments of the invention are directed to a method of fabricating gate stacks over channel fins in an n-type region and a p-type region of a substrate. A non-limiting example of the method includes forming a first channel fin in an n-type region of a substrate, forming a second channel fin in a p-type region of the substrate, and depositing a gate dielectric over the substrate and the first and second channel fins. A work function metal stack is deposited over the gate dielectric, the first channel fin in the n-type region, and the second channel fin in the p-type region. The work function metal stack over the gate dielectric and the first channel fin in the n-type region forms a first work function metal stack. The work function metal stack over the gate dielectric and the second fin in the p-type region forms a second work function metal stack. The first work function metal stack includes at least one shared layer of work function metal that is shared with the second work function metal stack.

Embodiments of the invention are directed to a method of fabricating gate stacks over channel fins in an n-type region and a p-type region of a substrate. A non-limiting example of the method includes forming a first channel fin and a second channel fin in an n-type region of a substrate, forming a third channel fin and a fourth channel fin in a p-type region of the substrate, and depositing a gate dielectric over the substrate and the first, second, third and fourth channel fins. A work function metal stack is deposited over the gate dielectric, the first channel fin in the n-type region, the second channel fin in the n-type region, the third channel fin in the p-type region, and the fourth channel fin in the p-type region. The work function metal stack over the gate dielectric and the first channel fin in the n-type region forms a first work function metal stack. The work function metal stack over the gate dielectric and the second channel fin in the n-type region forms a second work function metal stack. The work function metal stack over the gate dielectric and the third channel fin in the p-type region forms a third work function metal stack. The work function metal stack over the gate dielectric and the fourth fin in the p-type region forms a fourth work function metal stack. The first work function metal stack includes at least one shared layer of work function metal that is shared with at least one of the second work function metal stack, the third work function metal stack, and the fourth work function metal stack. In some embodiments of the invention, the second work function metal stack includes at least one shared layer of work function metal that is shared with the third work function metal stack. In some embodiments of the invention, the third work function metal stack includes at least one shared layer of work function metal that is shared with the fourth work function metal stack.

Embodiments of the invention are directed to a semiconductor wafer structure having a configuration of gate stacks over channel fins in an n-type region and a p-type region of a substrate. The wafer structure includes a first channel fin in an n-type region of a substrate, a second channel fin in a p-type region of the substrate, and a gate dielectric over the substrate and the first and second channel fins. A work function metal stack is over the gate dielectric, the first channel fin in the n-type region, and the second channel fin in the p-type region. The work function metal stack over the gate dielectric and the first channel fin in the n-type region forms a first work function metal stack. The work function metal stack over the gate dielectric and the second fin in the p-type region forms a second work function metal stack. The first work function metal stack includes at least one shared layer of work function metal that is shared with the second work function metal stack.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 2-15 depict various cross-sectional views of a non-planar fin-based transistor structure after various fabrication operations for implementing a gate formation scheme configured and arranged to provide separately tunable threshold voltages in accordance with aspects of the invention, in which:

FIG. 2 depicts a cross-sectional view of a portion of a semiconductor wafer after initial fabrication operations according to embodiments of the invention;

FIG. 3 depicts a cross-sectional view of a portion of a semiconductor wafer after fabrication operations according to embodiments of the invention;

FIG. 4 depicts a cross-sectional view of a portion of a semiconductor wafer after fabrication operations according to embodiments of the invention;

FIG. 5 depicts a cross-sectional view of a portion of a semiconductor wafer after fabrication operations according to embodiments of the invention;

FIG. 6 depicts a cross-sectional view of a portion of a semiconductor wafer after fabrication operations according to embodiments of the invention;

FIG. 7 depicts a cross-sectional view of a portion of a semiconductor wafer after fabrication operations according to embodiments of the invention;

FIG. 8 depicts a cross-sectional view of a portion of a semiconductor wafer after fabrication operations according to embodiments of the invention;

FIG. 9 depicts a cross-sectional view of a portion of a semiconductor wafer after fabrication operations according to embodiments of the invention;

FIG. 10 depicts a cross-sectional view of a portion of a semiconductor wafer after fabrication operations according to embodiments of the invention;

FIG. 11 depicts a cross-sectional view of a portion of a semiconductor wafer after fabrication operations according to embodiments of the invention;

FIG. 12 depicts a cross-sectional view of a portion of a semiconductor wafer after fabrication operations according to embodiments of the invention;

FIG. 13 depicts a cross-sectional view of a portion of a semiconductor wafer after fabrication operations according to embodiments of the invention;

FIG. 14 depicts a cross-sectional view of a portion of a semiconductor wafer after fabrication operations according to embodiments of the invention; and FIG. 15 depicts a cross-sectional view of a portion of a semiconductor wafer after fabrication operations according to embodiments of the invention;

DETAILED DESCRIPTION

It is understood in advance that although this invention includes a detailed description of exemplary gate formation schemes applied to non-planar FinFET architectures, embodiments of the invention are not limited to the particular FET architectures or materials described in this specification. Rather, embodiments of the present invention are capable of being implemented in conjunction with any other type of planar or non-planar FET architecture or material, now known or later developed. Examples of suitable FET architectures include, but are not limited to, horizontal gate all around (e.g., nanosheet) transistors and vertical gate all around transistors.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, MOSFET-based ICs are fabricated using so-called complementary metal oxide semiconductor (CMOS) fabrication technologies. In general, CMOS is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

Figure 1:
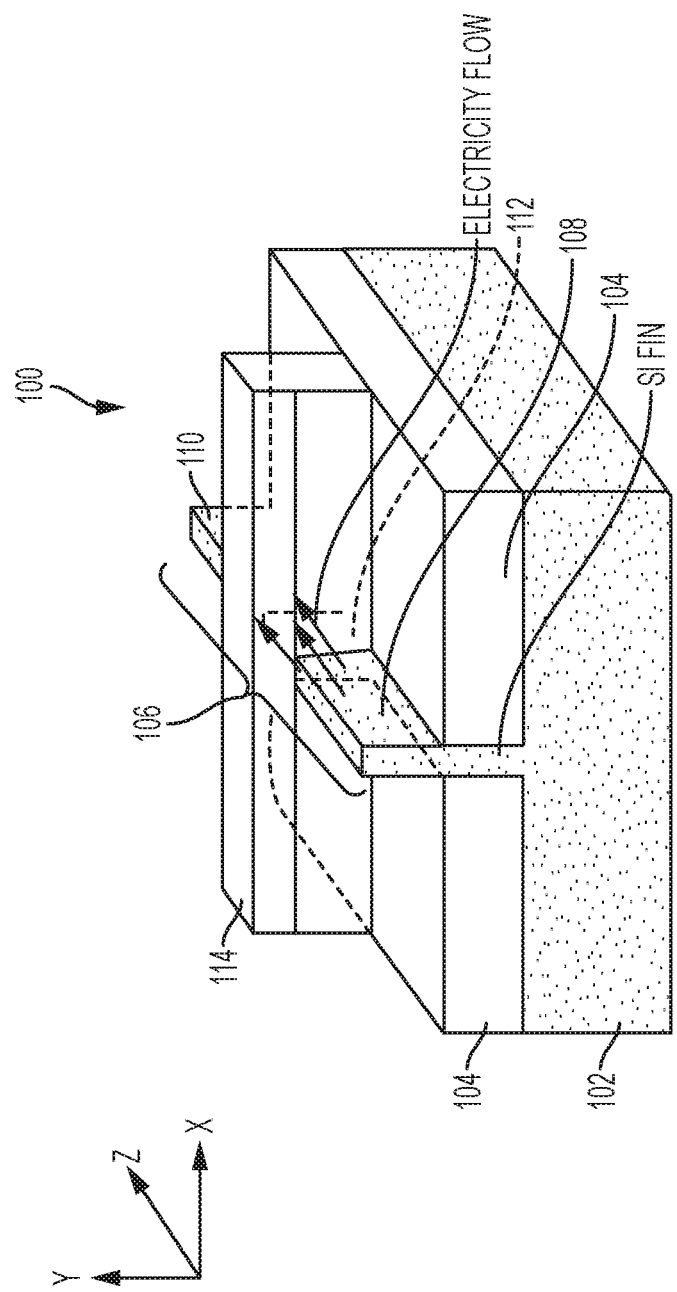
FIG. 1 depicts a three-dimensional view of an exemplary configuration of a FinFET device capable of incorporating a gate formation scheme in accordance with aspects of the invention.

One particularly advantageous type of MOSFET is known generally as a fin-type field effect transistor (FinFET). FIG. 1 depicts a three-dimensional view of an exemplary FinFET 100, which includes a shallow trench isolation (STI) region 104 for isolation of active areas from one another. The basic electrical layout and mode of operation of FinFET 100 do not differ significantly from a traditional field effect transistor. FinFET 100 includes a semiconductor substrate 102, local STI region 104, a fin 106, and a gate 114 having a gate oxide layer (not shown) between the gate and the fin, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on local STI region 104 and substrate 102. Substrate 102 can be silicon, and local STI region 104 can be an oxide (e.g., $SiO_2$). Fin 106 can be silicon, SiGe, or any other channel materials. Gate 114 controls the source to drain current flow (labeled ELECTRICITY FLOW in FIG. 1). In contrast to a planar MOSFET, however, source 108, drain 110 and channel 112 are built as a three-dimensional bar on top of local STI region 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The source and drain regions can be suitably doped to produce the desired FET polarity, as is known in the art. The dimensions of the fin establish the effective channel length for the transistor.

As previously noted herein, the Vt level of a MOSFET is the voltage that is required to turn the transistor on. As power and performance optimization have become increasingly important, the number of different Vt levels available on a process have proliferated. Multiple Vt levels allow designers to select the best option for each section of a design by trading-off power and performance. Vt is determined by several factors including the WF of the gate metal stack. It is generally desirable to provide different types of WFM in the gate electrode metal stacks, one for PFET transistors and one for the NFET transistors. The use of dual/multiple WFMs is part of optimizing the NFET and PFET Vt levels.

In non-planar, fully depleted channel architectures (e.g., FinFETs, gate-all-around (GAA) nanosheet transistors, and the like), providing multiple work function metals in the gate stacks is indispensable to achieving CMOS technology with multiple threshold voltages to take advantage of higher mobility and smaller device variability due to an absence of channel doping.

Turning now to a more detailed description of fabrication operations according to aspects of the invention, FIGS. 2-15 depict various cross-sectional views of a portion of a semiconductor wafer 200 after various fabrication operations for implementing a gate formation scheme configured and arranged to provide separately tunable Vt levels in accordance with aspects of the invention. The cross-sectional views shown in FIGS. 2-15 are looking at the semiconductor wafer 200 in the z-axis direction of the FinFET 100 (shown in FIG. 1), and the cross-sections shown in FIGS. 2-15 are cut through the gate 114 (shown in FIG. 1) along the x-axis. The gate formation scheme depicted in FIGS. 2-15 can be utilized to fabricate multiple instances of the FinFET 100, wherein the gate 114 of each instance of FinFET 100 instance includes a gate stack fabricated in accordance with aspects of the invention to have a tunable Vt level.

Figure 2:
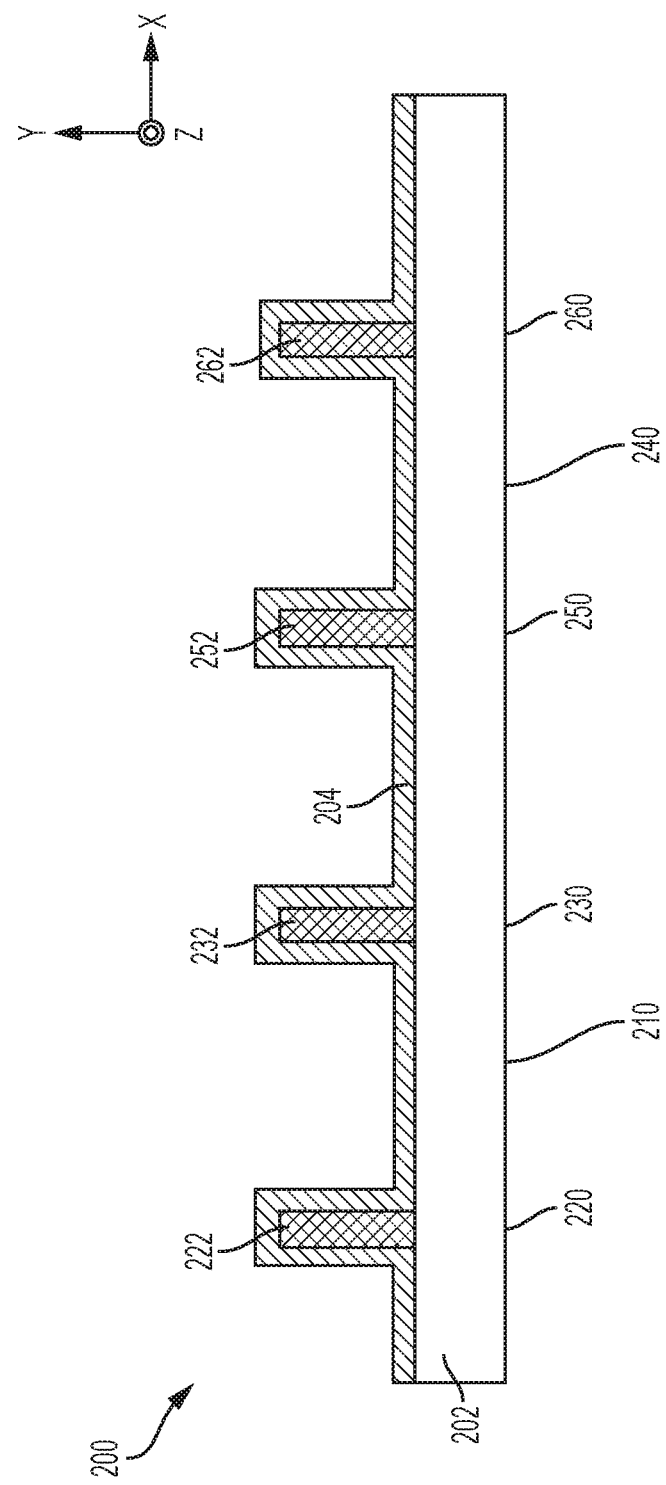

In FIG. 2, known semiconductor fabrication operations have been used to form the semiconductor wafer 200 to include a substrate 202, fins 222 formed in an NFET region 210 of the wafer 200, fins 232 formed in the NFET region 210 of the wafer 200, fins 252 formed in a PFET region 240 of the wafer 200, fins 262 formed in the PFET region 240 of the wafer 200, and a gate dielectric layer (e.g., a high-k gate dielectric) 204 formed over the substrate 202 and the fins 222, 232, 252, 262. The fins 222 will form the channel region of an NFET, and a gate stack will be formed on the fins 222, wherein the gate stack is configured to provide a Vt level of NVt 220. The fins 232 will form the channel region of an NFET, and a gate stack will be formed on the fins 232, wherein the gate stack is configured to provide a Vt level of NVt 230. The fins 252 will form the channel region of a PFET, and a gate stack will be formed on the fins 252, wherein the gate stack is configured to provide a Vt level of PVt 250. The fins 262 will form the channel region of a PFET, and a gate stack will be formed on the fins 262, wherein the gate stack is configured to provide a Vt level of PVt 260. Although a single instance of each of the fins 222, 232, 252, 262 is depicted in FIGS. 2-15, it is understood that, in practice, the NFET region 210 will include multiple instances of each fin 222, 232, and the PFET region 240 will include multiple instances of each fin 252, 262. Additionally, it is understood that, in practice, the FET devices that will be formed in the NFET region 210 and the PFET region 240 of the wafer 200 will be fabricated in accordance with CMOS architectures and fabrication technology that uses complementary and symmetrical pairs of p-type and n-type MOSFETs to implement logic functions. Accordingly, a variety of NFET and PFET shared gate pairs 200A, 200B, 200C, 200D (shown in FIGS. 16-19) can be formed in accordance with aspects of the invention.

At the fabrication stage shown in FIG. 2, poly-silicon gates (i.e., dummy gates) (not shown) have been removed from between gate spacers (not shown) and from over/around the fins 222, 232, 252, 262, and the removed dummy gate will be replaced by a multi-Vt gate stack (e.g., as shown in FIG. 14-19) in accordance with aspects of the invention. The gate stack can be formed before or after the source and drain regions (e.g., source region 108 and drain region 110 shown in FIG. 1) are doped. Forming the gate stack last (i.e., after formation of the source and drain regions) is known generally as a replacement metal gate (RMG) process flow.

The fins 222, 232, 252, 262 are arranged on the substrate 202. As used herein, the term "substrate" can be any suitable substrate material, such as, for example, any semiconductor material including, but not limited to, silicon. In embodiments of the invention where the substrate 202 is a remaining semiconductor material portion of a bulk semiconductor substrate, the substrate 202 will be of a single crystalline semiconductor material, such as, for example, single crystalline silicon. In some embodiments of the invention, the crystal orientation of the remaining semiconductor portion of the bulk semiconductor substrate can be {100}, {110}, {111} or any other of the well-known crystallographic orientations. As will be described in greater detail below, each semiconductor fin 222, 232, 252, 262 can include the same semiconductor material, or a different semiconductor material, from the substrate 202. In some embodiment of the invention, the substrate 202 can include an insulator layer such that a semiconductor on insulator (SOI) substrate is formed. In some embodiments of the invention, the substrate 202 can be a bulk semiconductor substrate. Non-limiting examples of suitable fin materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

The gate dielectric layer 204 is deposited over the substrate 202 and the fins 222, 232, 252, 262 are then annealed. In embodiments of the invention, the gate dielectric 204 includes an interfacial layer. The gate dielectric 204 can be deposited using any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In one or more embodiments of the invention, the thickness of the gate dielectric 204 can range from about 1 nm to about 5 nm, although less thickness and greater thickness are also contemplated. The gate dielectric 204 can include any suitable dielectric material, including but not limited to silicon oxide, silicon nitride, silicon oxynitride, high-k materials (e.g., k>about 7.0), or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as lanthanum, aluminum, magnesium.

Figure 3:
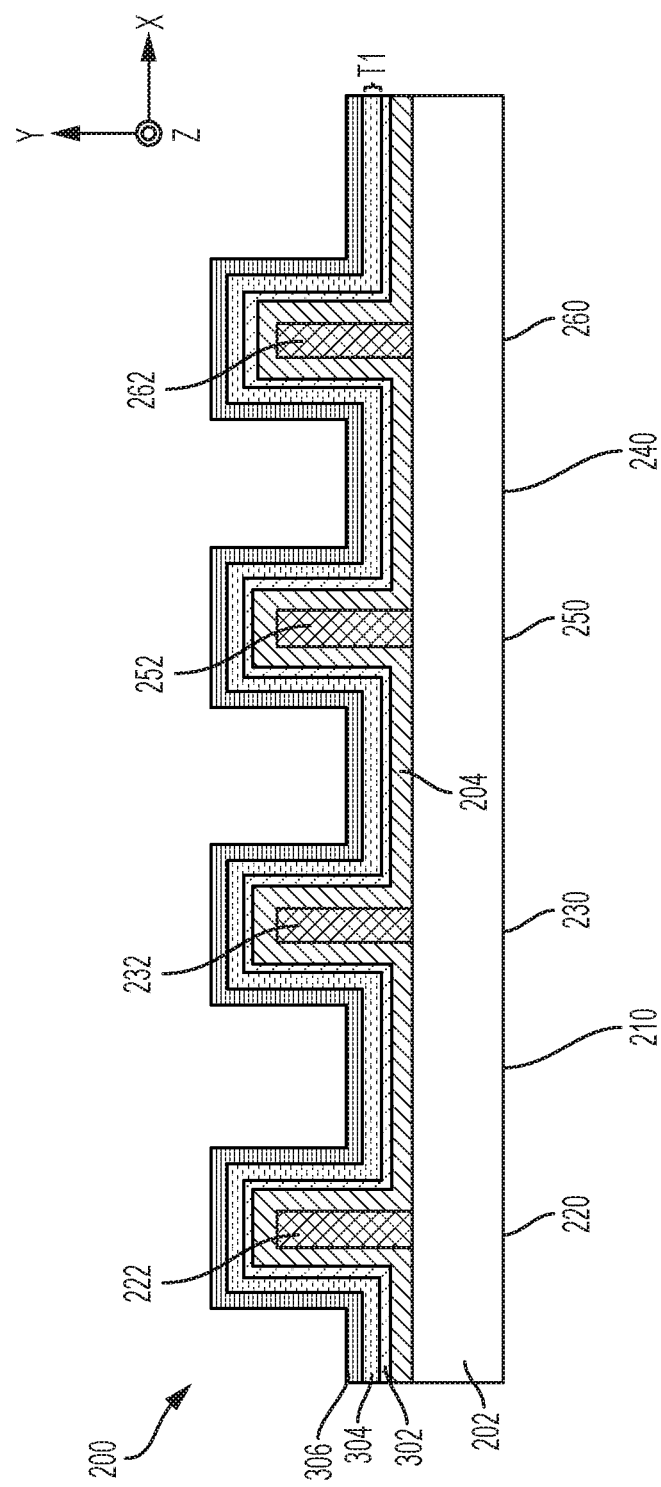

In FIG. 3, known fabrication operations have been used to conformally deposit over the substrate 202 and the fins 222, 232, 252, 262 an initial tri-layer of work function metals, including, for example, a barrier layer 302, an NFET scavenging metal layer 304, and a first capping layer 306, configured and arranged as shown. The barrier layer 302 is used to prevent the scavenging metal layer 304 from directly landing on the gate dielectric layer 204 (e.g., a high-k dielectric) and degrading overall device performance. The barrier layer 302 can be a metal nitride such as TiN. The scavenging metal layer 304 is used to scavenge oxygen from the gate dielectric layer 204 (e.g., a high-k) to thereby modulate the effective work function. The NFET scavenging metal layer 304 can include, for example, TiAl, Ti, Al, TiAlC, NbAlC, TaAlC, NbAl, other Ti Alloys, or Al Alloys. The capping layer 306 is used to protect the scavenging metal layer 304 from being attacked by the various patterning materials and applied patterning process. The first capping layer 306 can be TiN. In embodiments of the invention, the barrier layer 302, the NFET scavenging metal layer 304, and the first capping layer 306 each has a substantially uniform thickness. More specifically, at this fabrication stage, the NFET scavenging metal layer 304 has a thickness of T1. Any suitable deposition process can be used to deposit the tri-layer of work function metals 302, 304, 306, including, for example, an ALD deposition. In accordance with aspects of the invention, the initial tri-layer of work function metals 302, 304, 306 will all contribute to the final NVt1 220 in the NFET region 210. In accordance with aspects of the invention, portions of the work function metals 302, 304 will contribute to the final NVt2 230 in the NFET region 210. In accordance with aspects of the invention, portions of the work function metals 302, 304 will contribute to the final PVt1 250 in the PFET region 240. In accordance with aspects of the invention, none of the initial tri-layer of the work function metals 302, 304, 306 will contribute to the final PVt2 260 in the PFET region 240.

Figure 4:
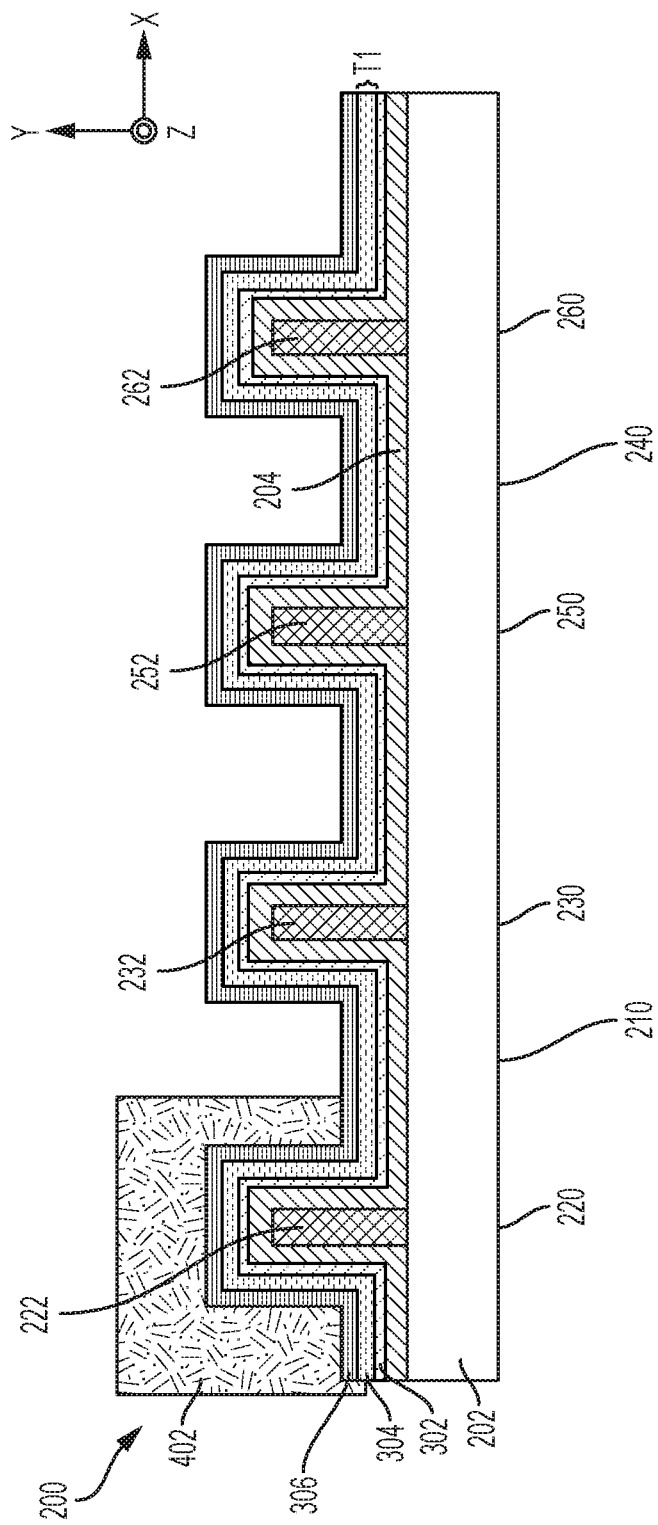

In FIG. 4, known fabrication operations have been used to deposit a mask 402 over NVt 220 in the NFET region 210 of the wafer 200.

Figure 5:
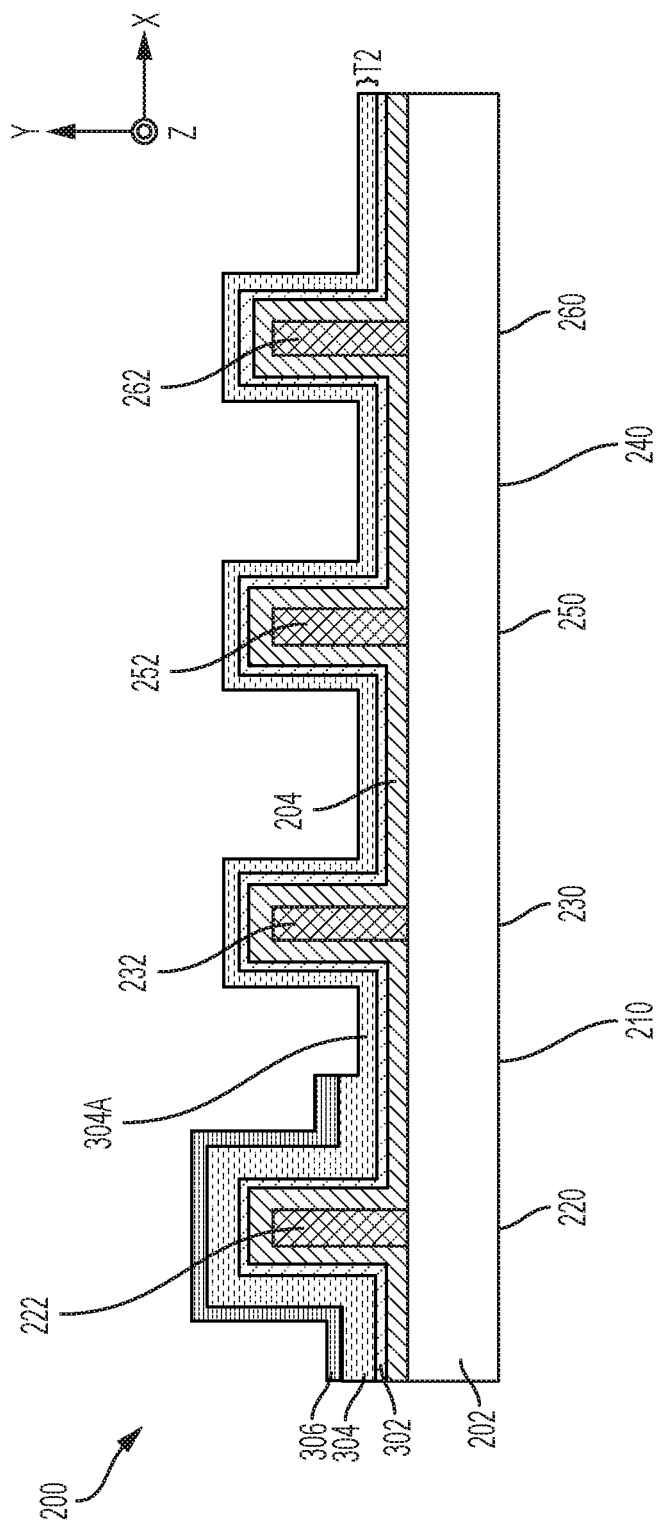

In FIG. 5, known fabrication operations have been used to remove the first capping layer 306 and a portion of the NFET scavenging metal layer 304 from over unmasked portions of the substrate 202 and the fins 232, 252, 262. In accordance with aspects of the invention, removing a portion of the NFET scavenging metal layer 304 results in a NFET scavenging metal layer 304A having a thickness dimension T2, wherein the NFET scavenging metal layer 304A is over unmasked portions of the substrate 202 and the fins 232, 252, 262. In accordance with aspects of the invention, T2 is less than T1. In accordance with aspects of the invention, the work function metals 302, 304A will both contribute to the final NVt2 230 in the NFET region 210. In aspects of the invention, the removal process for removing portions of the NFET scavenging metal layer 304 can be timed to achieve the desired resulting thickness T2 of the NFET scavenging metal layer 304A.

Figure 6:
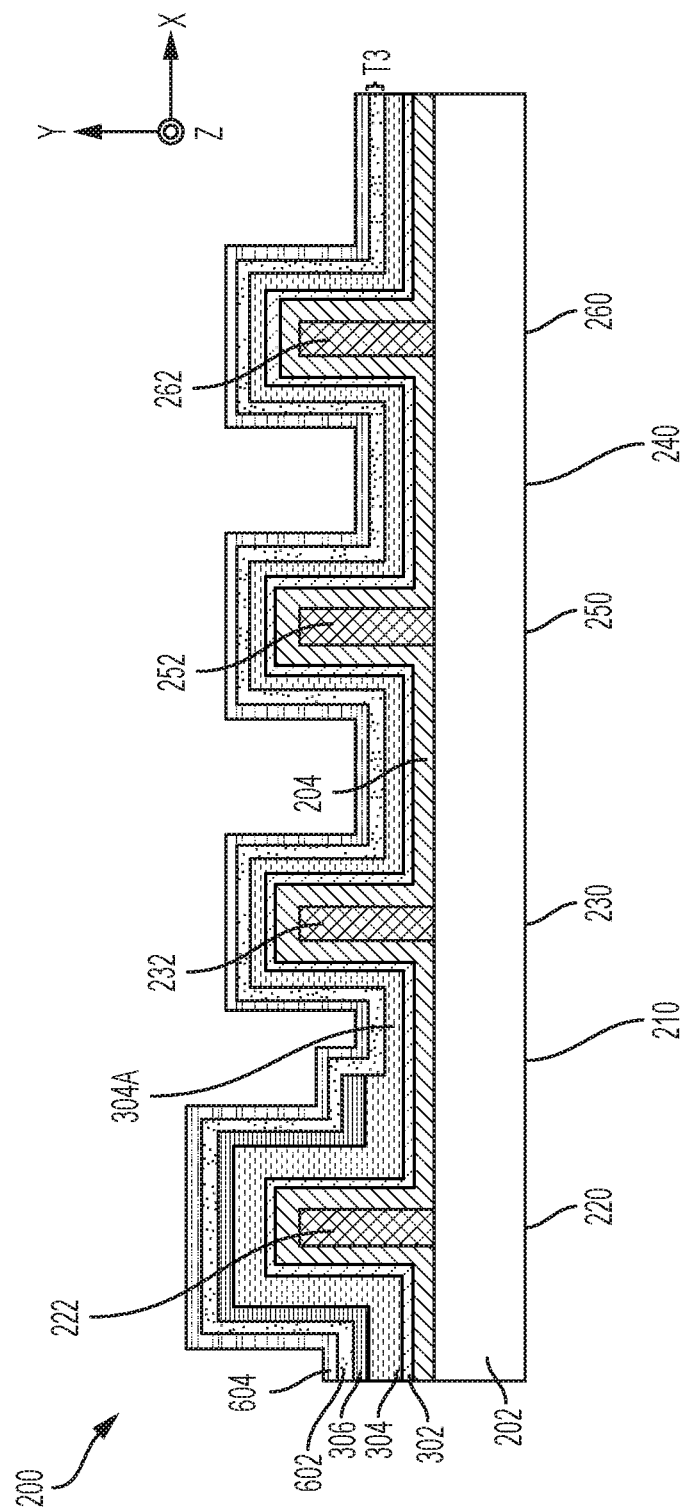

In FIG. 6, known fabrication operations have been used to conformally deposit over the wafer 200 a bi-layer of work function metals, including, for example, an NFET scavenging metal layer 602 and a second capping layer 604, configured and arranged as shown. In embodiments of the invention, the NFET scavenging metal layer 602 and the second capping layer 604 each have substantially uniform thickness. In some embodiments of the invention, only a single work function metal (e.g., NFET scavenging metal layer 602) can be deposited depending upon the requirements for NVt2 230. At this fabrication stage, the NFET scavenging metal layer 602 has a thickness of T3. In some embodiments of the invention, the nFET scavenging metal layer 602 can include, for example, TiAl, Ti, Al, TiAlC, NbAlC, TaAlC, NbAl, other Ti Alloys, or Al Alloys. In some embodiments of the invention, the NFET scavenging metal layer 602 could be formed from the same material as the NFET scavenging metal layer 304 but have different thickness. In some embodiments of the invention, the NFET scavenging metal layer 602 can be formed from a different material than the NFET scavenging metal layer 304 with similar thickness or different thickness. The second capping layer 604 can be TiN. Any suitable deposition process can be used to deposit the bi-layer of work function metals 602, 604, including, for example, an ALD deposition. In accordance with aspects of the invention, the bi-layer work function metals 602, 604 and the initial tri-layer of work function metals 302, 304, 306 will all contribute to the final NVt1 220 in the NFET region 210. In accordance with aspects of the invention, the bi-layer work function metals 602, 604 and portions of the work function metals 302, 304 will contribute to the final NVt2 230 in the NFET region 210. Accordingly, the bi-layer of work function metals 602, 604 "top off" the existing work function metal configuration by adding work function metal layers. In embodiments of the invention, these additional work function metal layers can help lower nVt2 and increase pVt1 to achieve the desired Vts.

Figure 7:
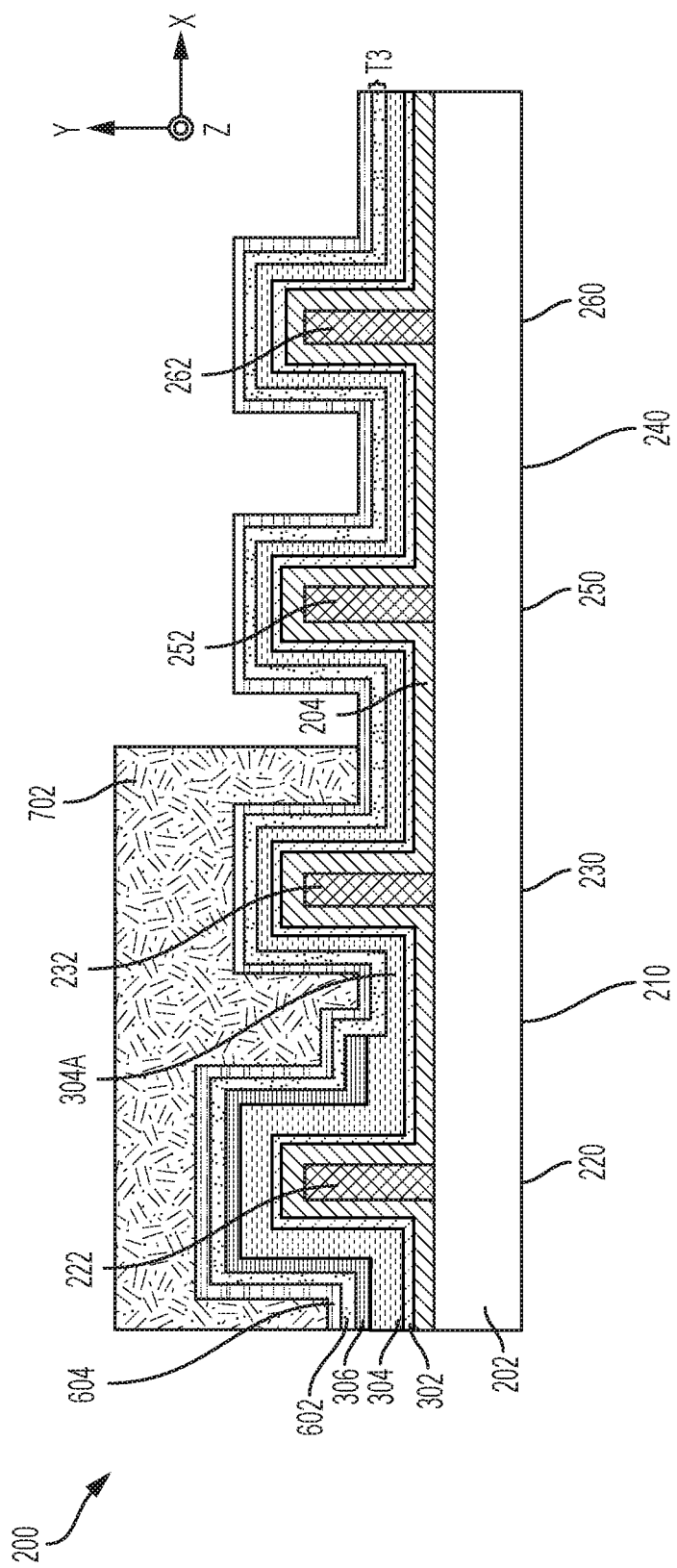

In FIG. 7, known fabrication operations have been used to deposit a mask 702 over NVt1 220 and NVt2 230 in the NFET region 210 of the wafer 200.

Figure 8:
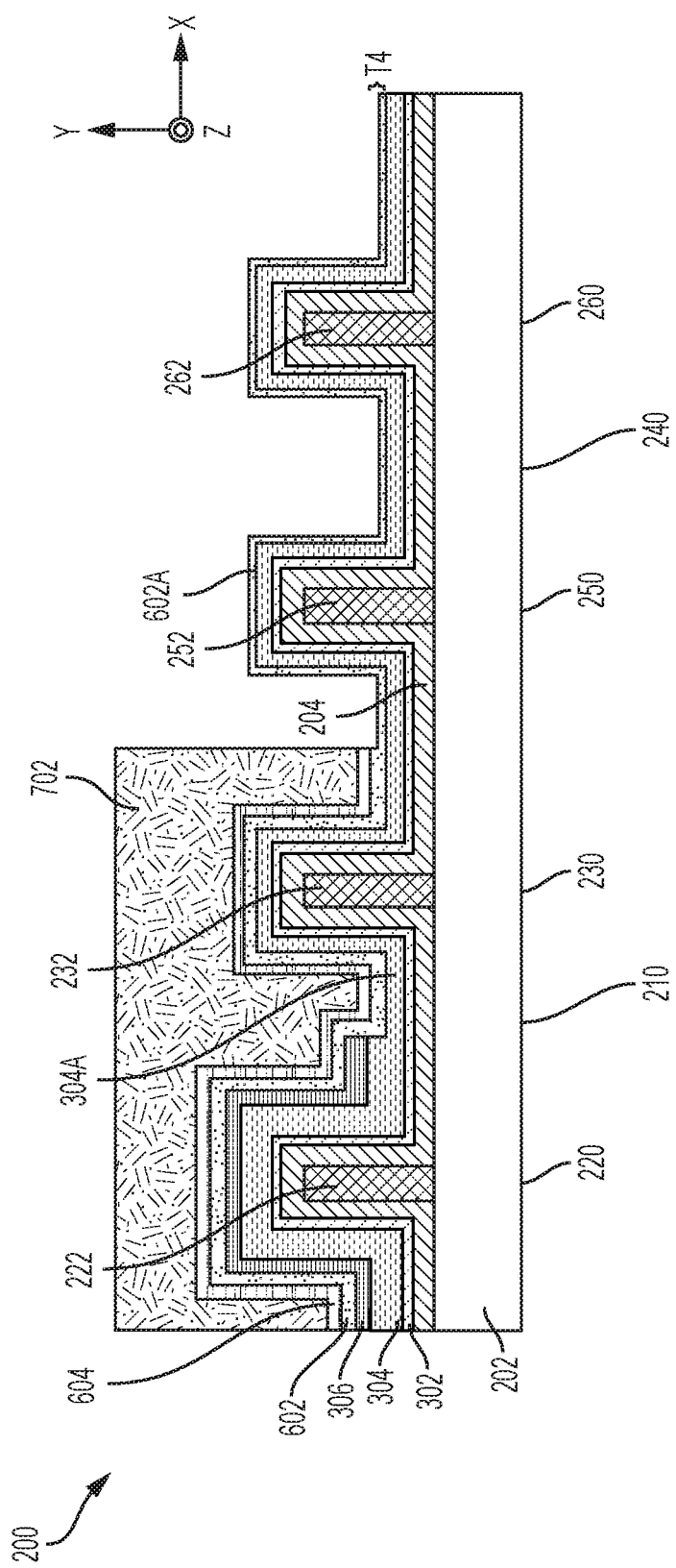

In FIG. 8, known fabrication operations have been used to remove the second capping layer 604 and a portion of the NFET scavenging metal layer 602 from over unmasked portions of the wafer 200. In accordance with aspects of the invention, removing a portion of the NFET scavenging metal layer 602 results in an NFET scavenging metal layer 602A having a thickness dimension T4, wherein the NFET scavenging metal layer 602A is over unmasked portions of the wafer 200. In aspects of the invention, the removal process for removing portions of the NFET scavenging metal layer 602 can be timed to achieve the desired resulting thickness T4 of the NFET scavenging metal layer 602 602A. In accordance with aspects of the invention, T4 is less than T3. In accordance with aspects of the invention, the work function metal 602A will contribute to the final PVt1 250 in the PFET region 240.

Figure 9:
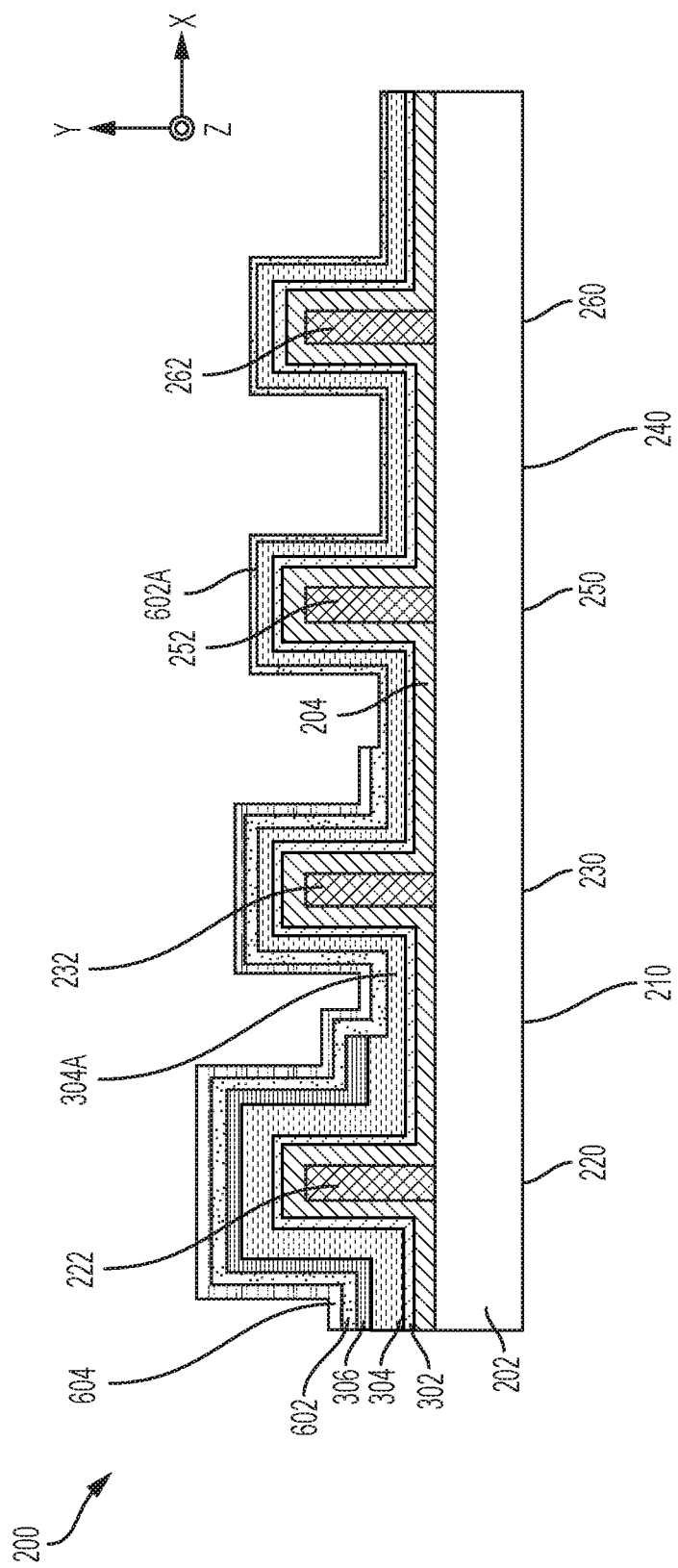
Figure 10:
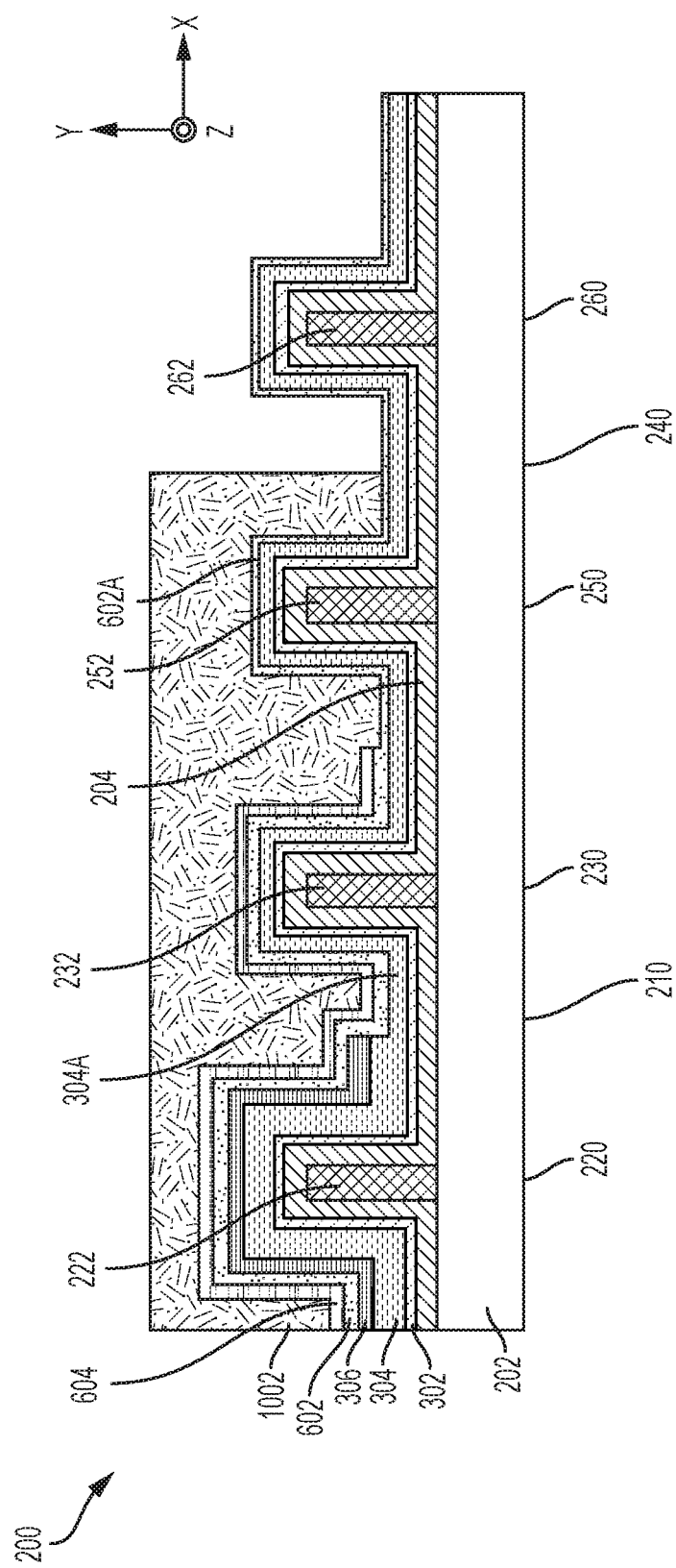

In FIG. 9, known fabrication operations have been used to remove the mask 702 from over NVt1 220 and NVt2 230 in the NFET region 210 of the wafer 200, and in FIG. 10, known fabrication operations have been used to deposit a mask 1002 over NVt1 220 and NVt2 230 in the NFET region 210 of the wafer 200, as well as over PVt1 250 in the PFET region 240 of the wafer 200.

Figure 11:
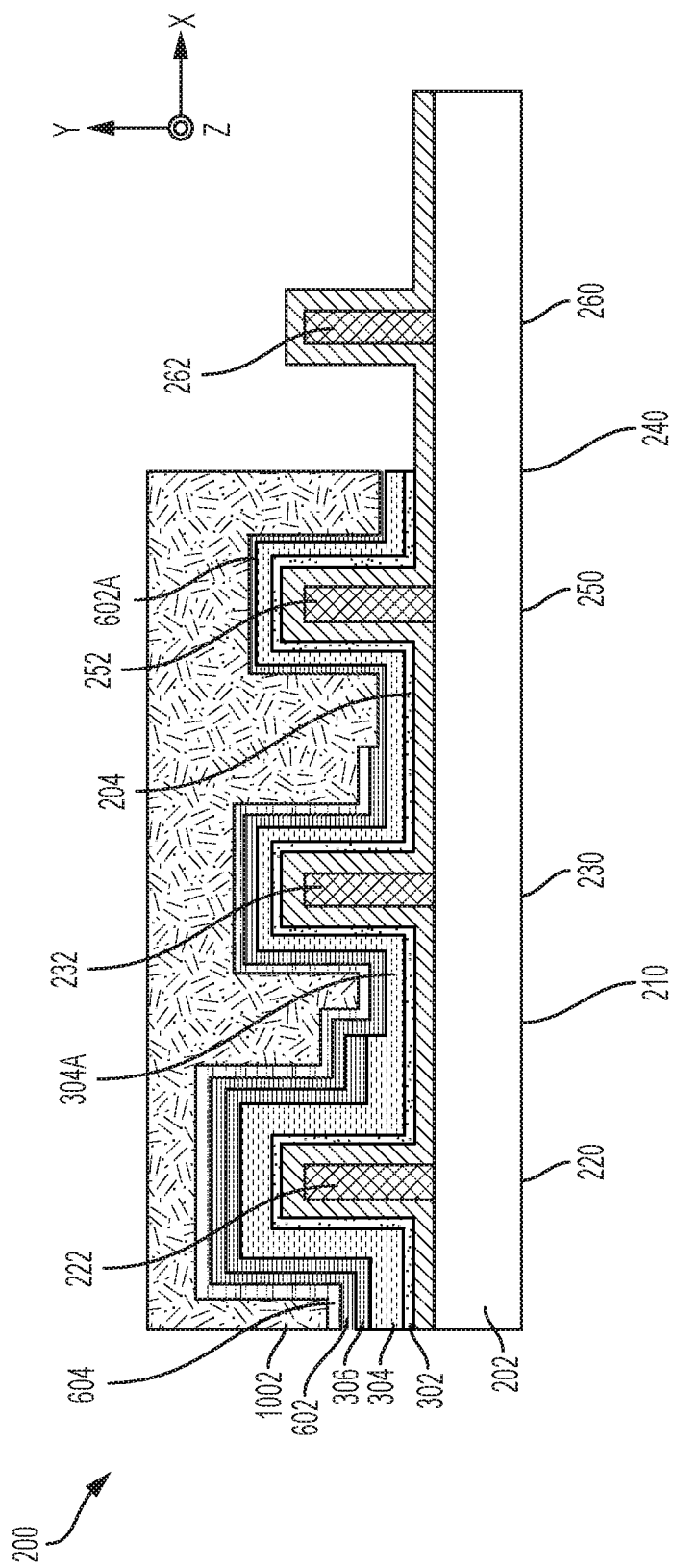

In FIG. 11, known fabrication operations have been used to remove the NFET scavenging metal layer 602A, the NFET scavenging metal layer 304A, and the barrier layer 302 from over unmasked portions of the wafer 200.

Figure 12:
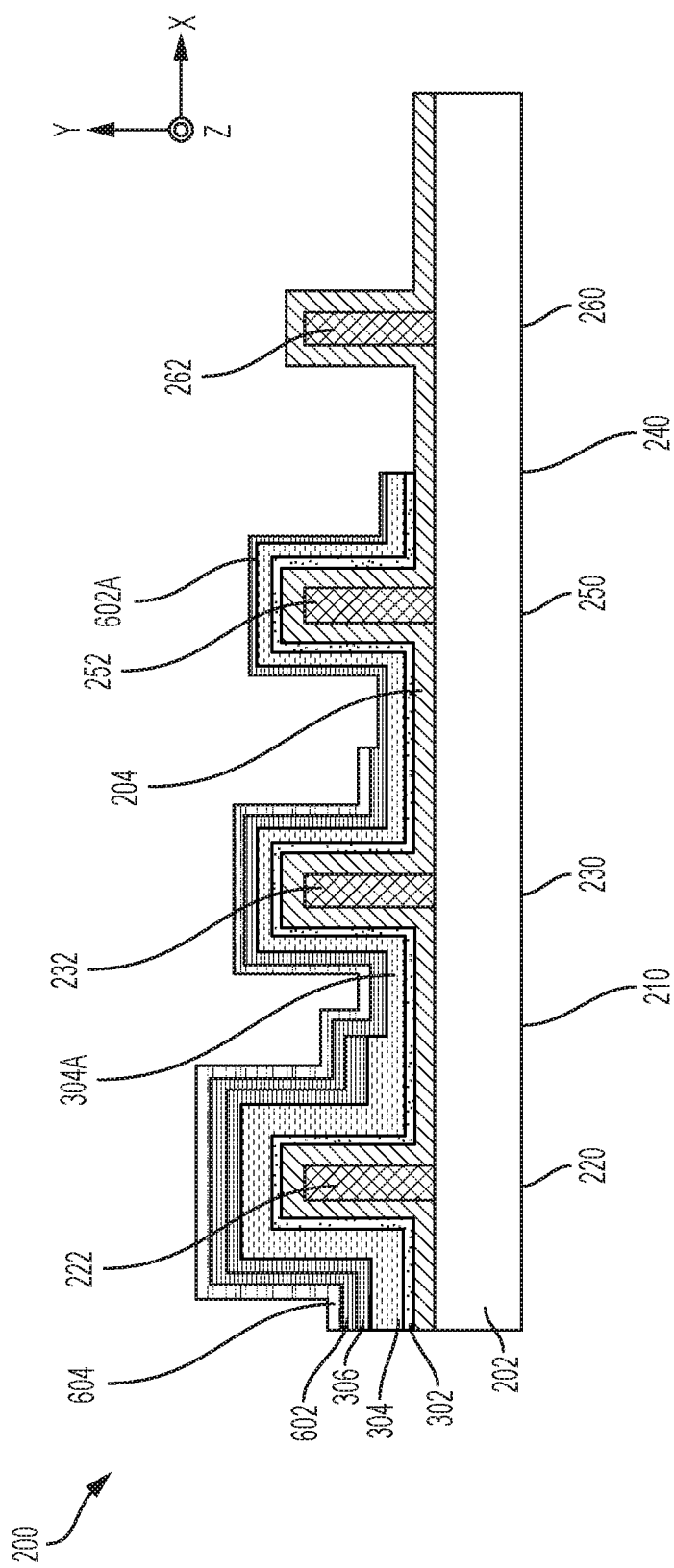

In FIG. 12, known fabrication operations have been used to remove the mask 1002 from over NVt1 220 and NVt2 230 in the NFET region 210 of the wafer 200, as well as from over PVt1 250 in the PFET region 240 of the wafer 200.

Figure 13:
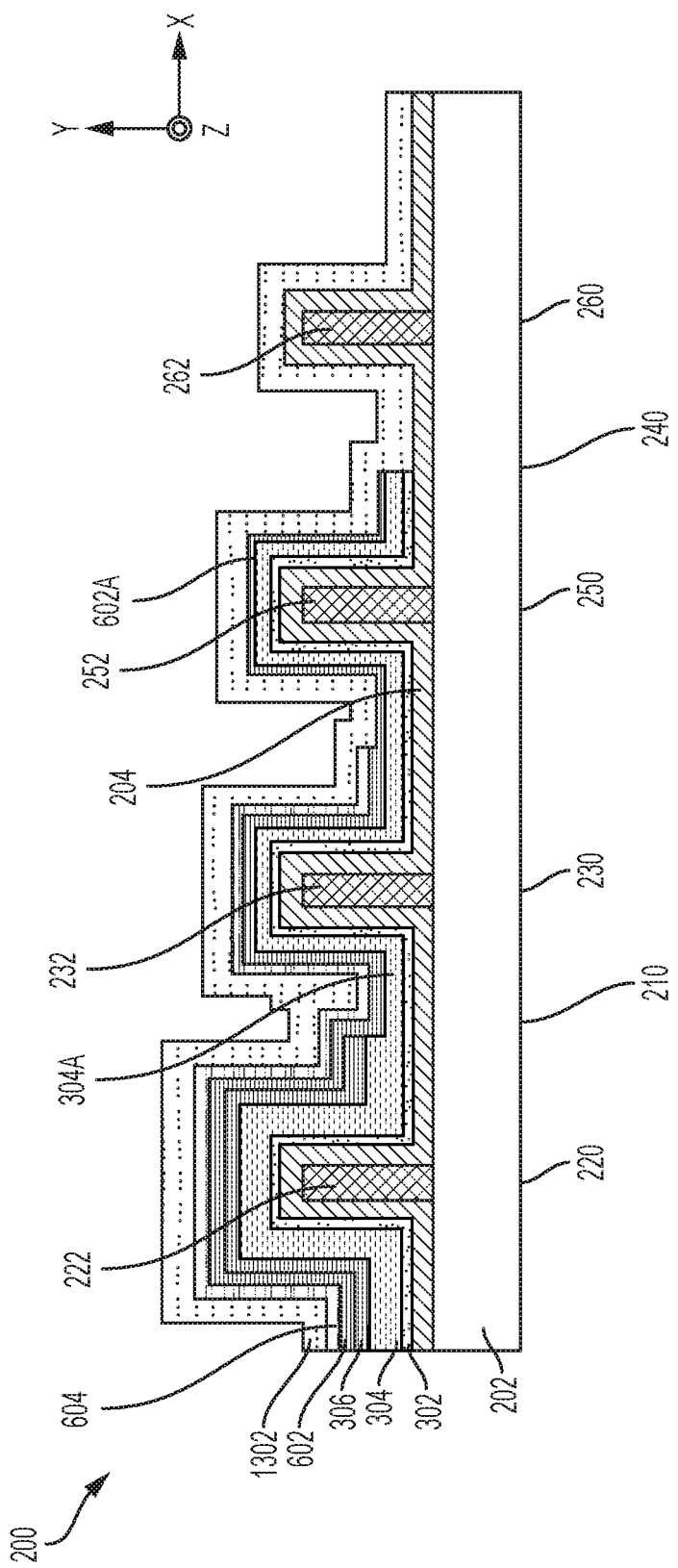

In FIG. 13, known fabrication operations have been used to conformally deposit over the wafer 200, and specifically over the gate dielectric 204 and the fin 262, a layer of work function metal, including, for example, a pFET work function metal layer 1302, configured and arranged as shown. In embodiments of the invention, the PFET work function metal layer 1302 has substantially uniform thickness. The PFET work function metal layer 1302 could be one layer of material or a stack with several materials. The PFET work function metal layer 1302 can include metal nitride materials such as TiN and TaN; metals such as ruthenium, palladium, platinum, cobalt, nickel, and conductive metal oxides; or any combination thereof. Any suitable deposition process can be used to deposit the work function metal 1302, including, for example, an ALD deposition. In accordance with aspects of the invention, the PFET work function metal layer 1302 sets the final PVt2 260 in the PFET region 240.

Figure 14:
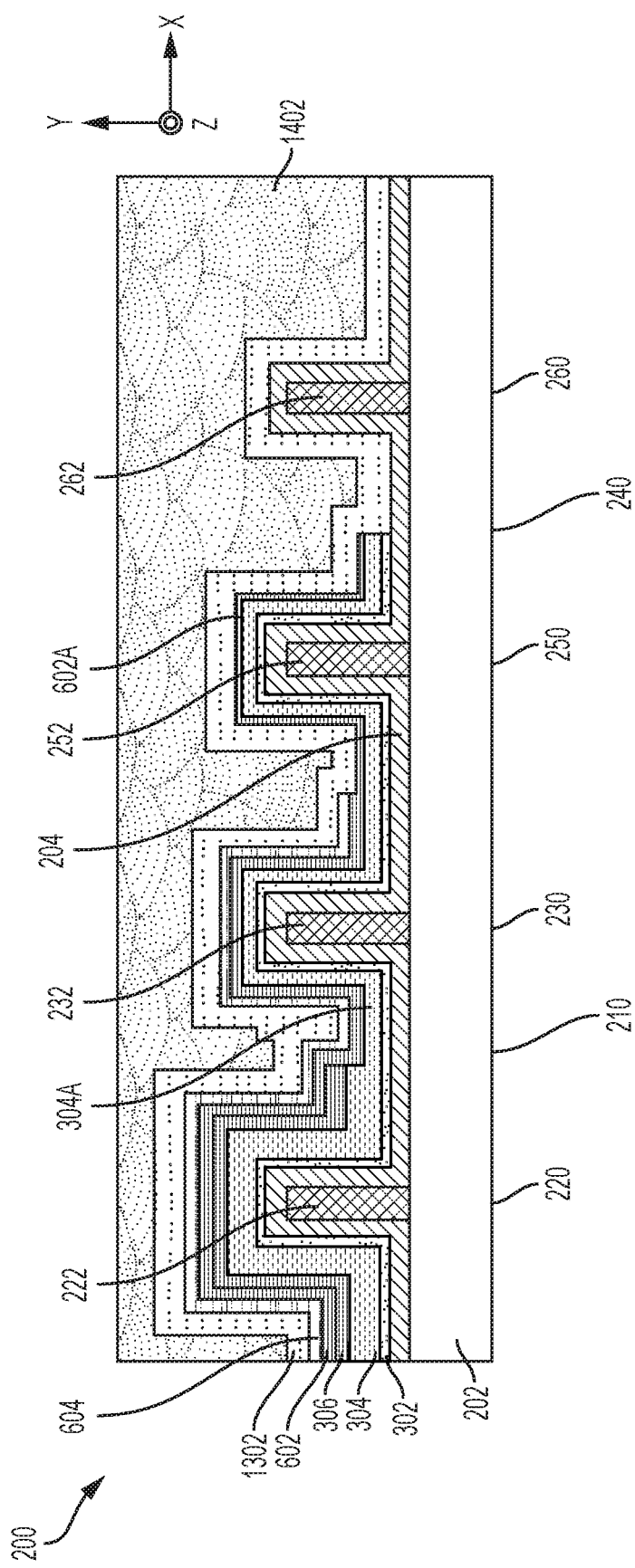
Figure 15:
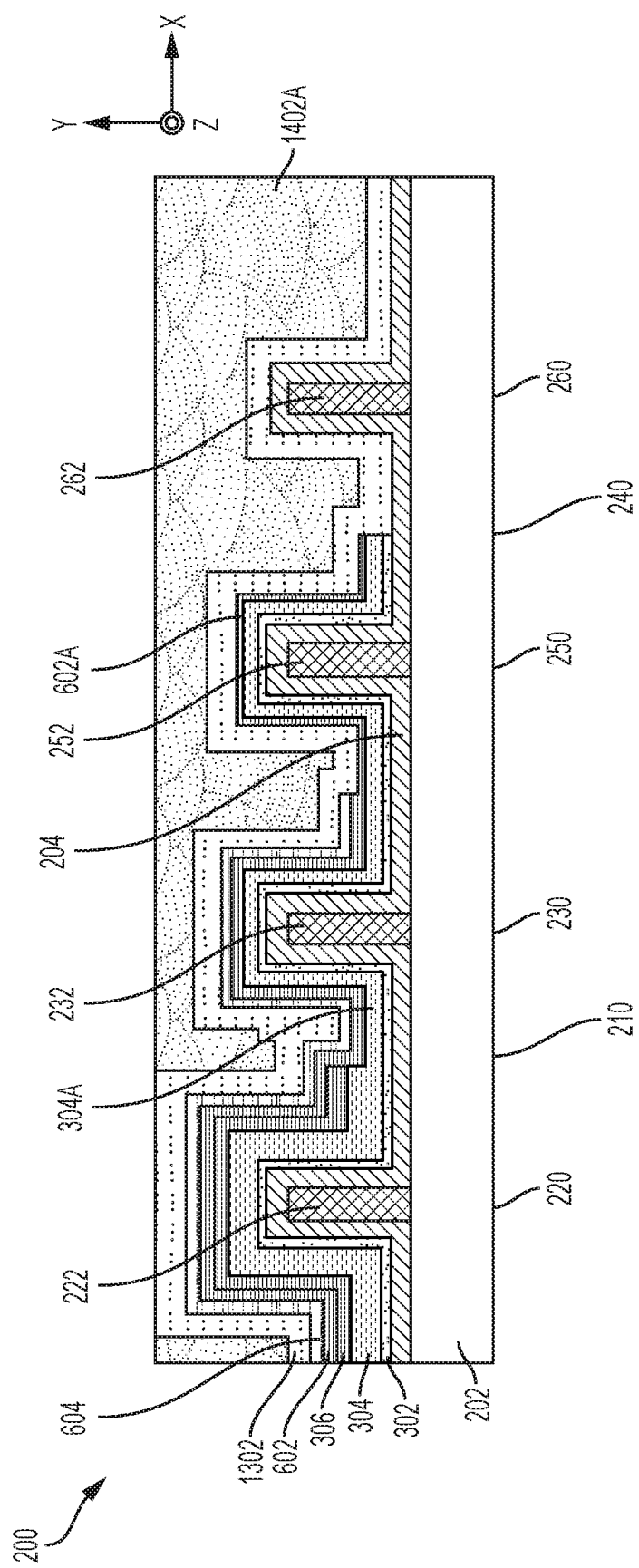
Figure 16:
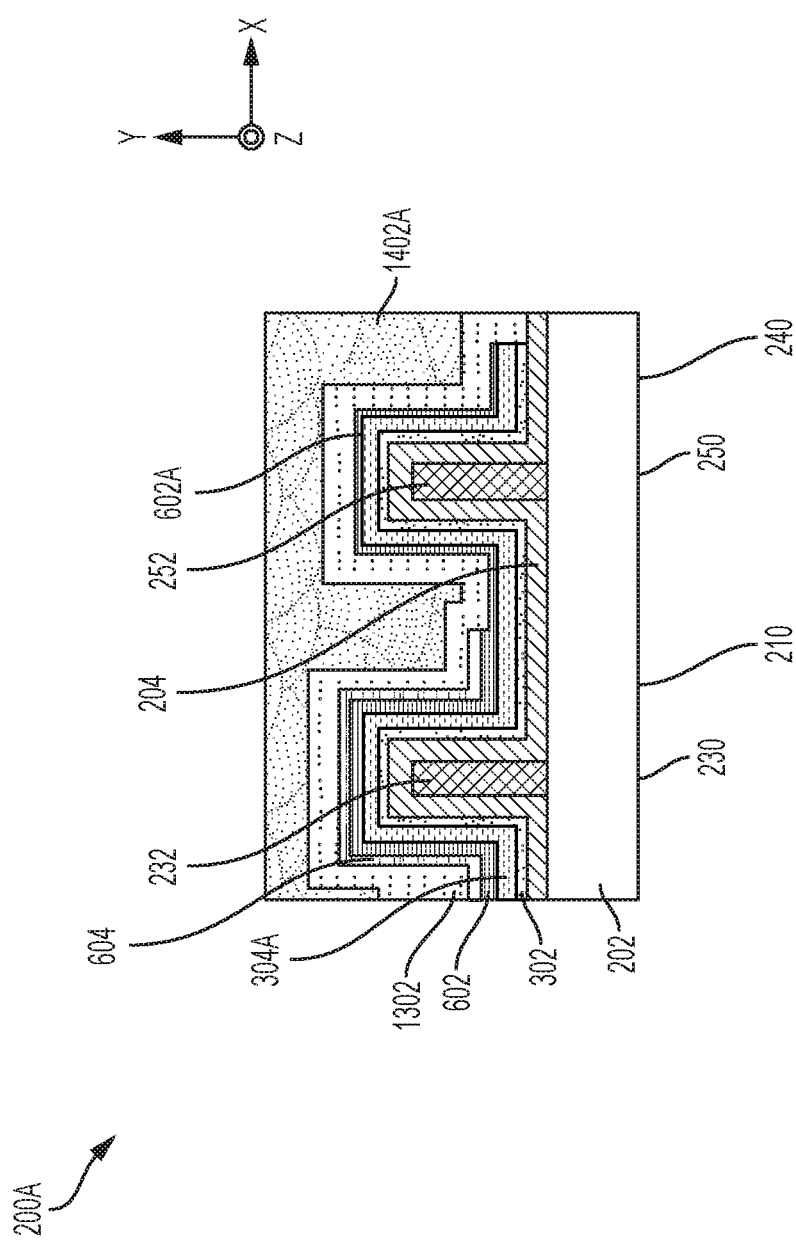
FIG. 16 depicts a cross-sectional of view of a portion of a semiconductor wafer illustrating an example of a shared gate between an n-type FET (NFET) and a p-type FET (PFET), wherein the threshold voltage of the NFET portion of the shared gate could be similar to or different from the threshold voltage of the PFET portion of the shared gate in accordance with aspects of the invention.
Figure 17:
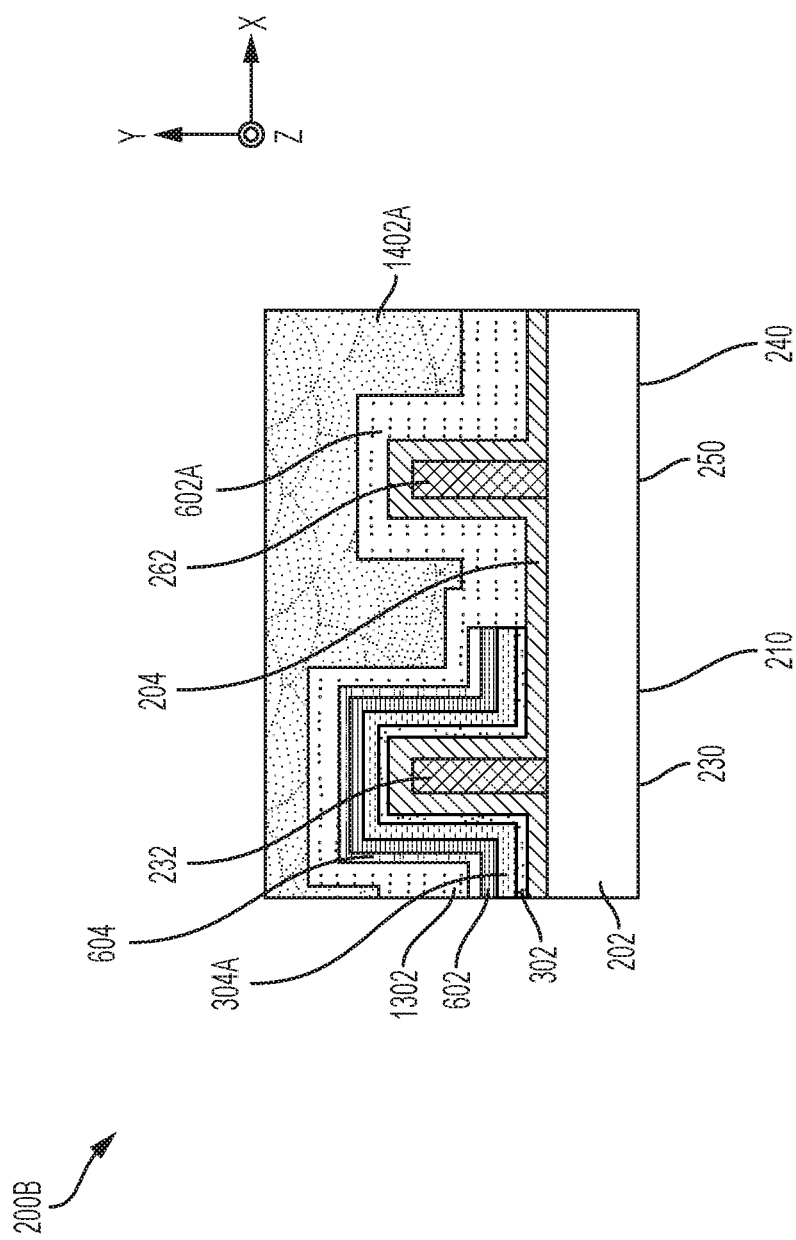
FIG. 17 depicts a cross-sectional of view of a portion of a semiconductor wafer illustrating another example of a shared gate between an NFET and a PFET, wherein the threshold voltage of the NFET portion of the shared gate is different than the threshold voltage of the PFET portion of the shared gate in accordance with aspects of the invention.
Figure 18:
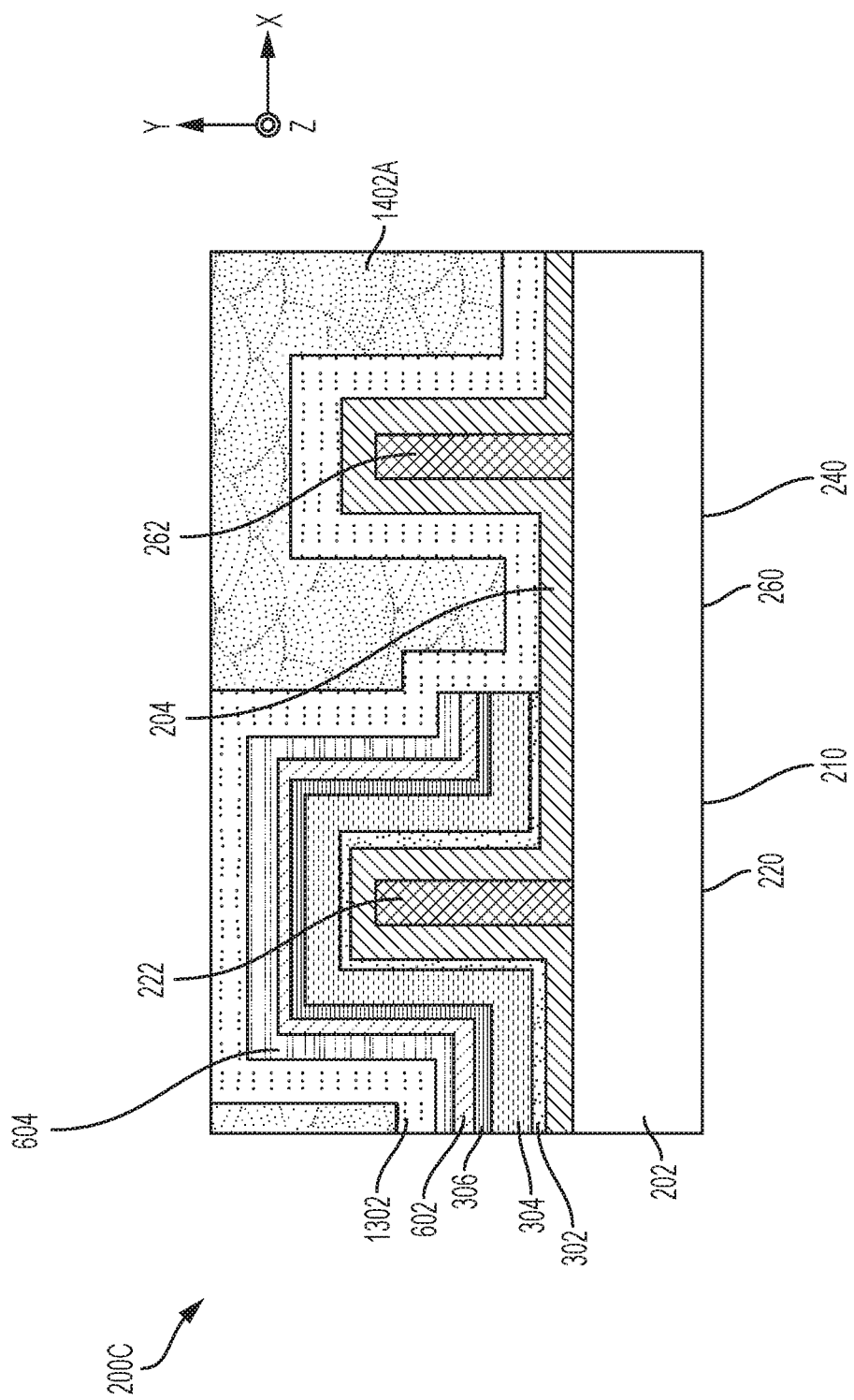
FIG. 18 depicts a cross-sectional of view of a portion of a semiconductor wafer illustrating another example of a shared gate between an NFET and a PFET, wherein the threshold voltage of the NFET portion of the shared gate could be similar to or different from the threshold voltage of the PFET portion of the shared gate in accordance with aspects of the invention.
Figure 19:
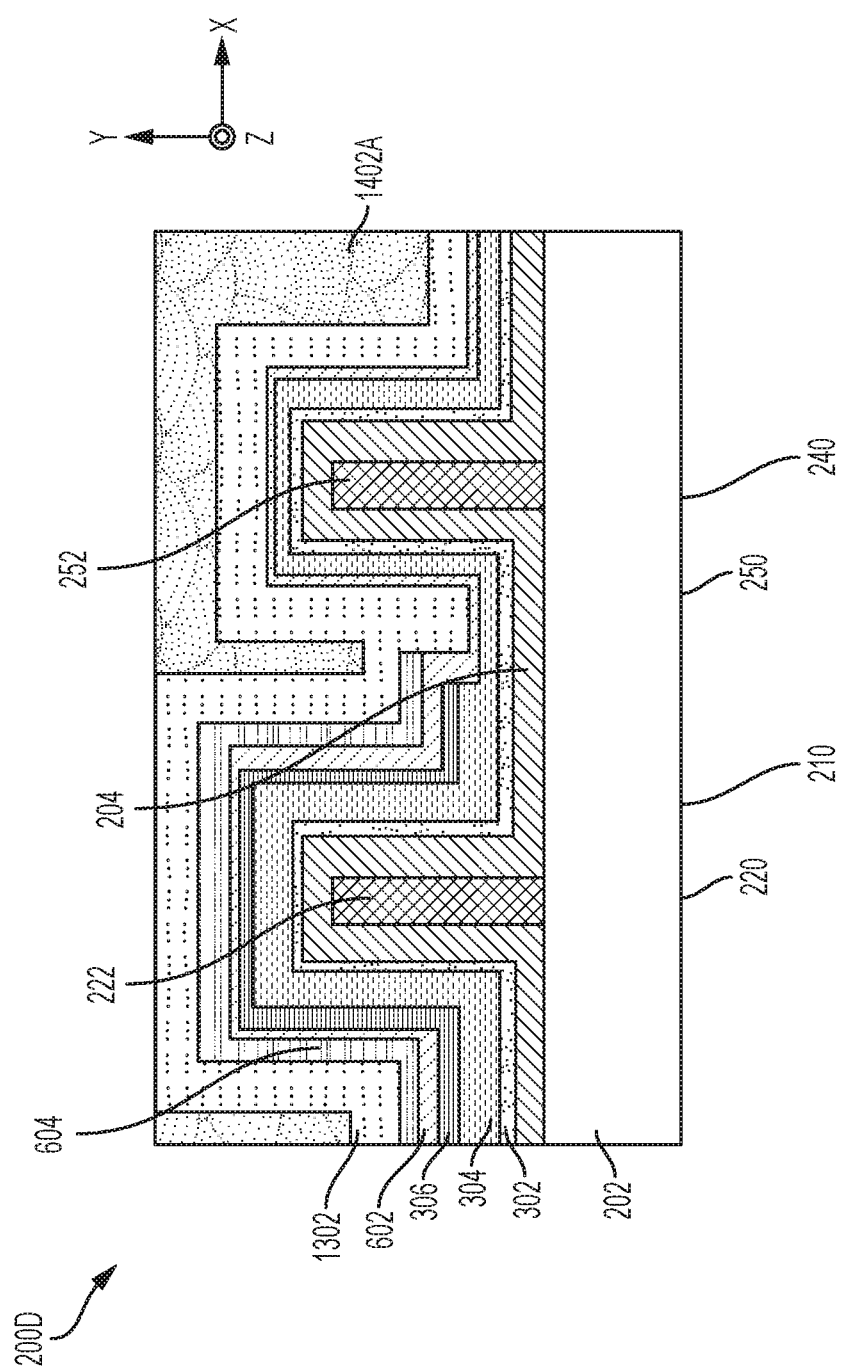
FIG. 19 depicts a cross-sectional of view of a portion of a semiconductor wafer illustrating another example of a shared gate between an NFET and a PFET, wherein the threshold voltage of the NFET portion of the shared gate is different than the threshold voltage of the PFET portion of the shared gate in accordance with aspects of the invention.

In FIG. 14, an RMG process in accordance with aspects of the invention is completed by depositing a conductive metal gate 1402 over the semiconductor wafer 200. In FIG. 15, the metal gate 1402 is planarized, using, for example, a CMP process, to form a planarized metal gate 1402A. The conductive metal gate 1402A, the various work function metal layers 302, 304, 304A, 306, 602, 602A, 604, 1302, and the gate dielectric 204 form the gate stacks for NVt1 220 and NVt2 230 in the NFET region 210, as well as for PVt1 250 and PVt2 260 in the PFET region 240. Non-limiting examples of suitable conductive metals for the conductive metal gate 1402A include aluminum (Al), platinum (Pt), gold (Au), tungsten (W), titanium (Ti), Cobalt (Co) or any combination thereof.

Vt is determined by several factors including the WF of the gate metal stack. Accordingly, using the gate stack formation scheme in accordance with aspects of the invention, NVt1 220 is influenced and/or set by the work function metal layers 302, 304, 306, 602, 604, 1302, NVt 230 is influenced and/or set by the work function metal layers 302, 304A, 602, 604, 1302, PVt1 250 is influenced and/or set by the work function metal layers 302, 304A, 602A, 1302, and PVt2 260 is influenced and/or set by the work function meal layer 1302. The use of different work function metals to form NVt1 220, NVt2 230, PVt1 250, PVt2 260 is part of optimizing the Vt for NFET devices in the NFET region 210, as well as optimizing Vt for PFET devices in the PFET region 240. The specific materials chosen for the work function metal layers 302, 304, 304A, 306, 602, 602A, 604, 1302 depends on the type of transistor. Non-limiting examples of suitable work function metals for PFET devices include p-type work function materials such as ruthenium, palladium, platinum, cobalt, nickel, and conductive metal oxides, or any combination thereof. Non-limiting examples of suitable work function metals for NFET devices include n-type work function materials such as hafnium, zirconium, titanium, tantalum, aluminum, metal carbides (e.g., hafnium carbide, zirconium carbide, titanium carbide, and aluminum carbide), aluminides, or any combination thereof.

The impact of the work function metal layers 302, 304, 304A, 306, 602, 602A, 604, 1302 on NVt1 220, NVt2 230, PVt1 250, and PVt2 260 can be tuned by adjusting a number of factors, including, for example, the type of work function material, the number of work function layers, the thickness of the work function layer, the post etch thicknesses of the work function layers (e.g., T2 and T4 shown in FIGS. 5 and 8, respectively), and what work function layers are shared between different gate stacks of the NFET and PFET devices in the NFET and PFET regions 210, 240, respectively.

In accordance with aspects of the invention, pairs of the Vt levels NVt1 220, NVt2 230, PVt1 250, and PVt2 260 are generated by shared portions of the various work function metal layers 302, 304, 304A, 306, 602, 602A, 604, 1302. Examples of NFET and PFET shared gate pairs include shared gate pair 200A (NVt1 220 and PVt1 250) shown in FIG. 16, shared gate pair 200B (NVt2 230 and PVt1 250) shown in FIG. 17, shared gate pair 200C (NVt1 220 and PVt2 260) shown in FIG. 18, and shared gate pair 200D (NVt2 230 and PVt2 260) shown in FIG. 19. In accordance with aspects of the invention, because NVt1 220 is less than NVt2 230, and because PVt1 250 is greater than PVt2 260, shared gate pairs 200B and 200C are more important than share gate pairs 200A and 200D, respectively. In embodiments of the invention, nVt1 is less than nVt2, pVt1 could have similar Vt as nVt2, and pVt2 could have similar Vt as nVt1. However, when they formed the shared gate, any combination of these two Vts from each polarity is possible. The scavenging metal's thickness determines the work function (i.e., Vt). For NFET devices, a thicker device scavenging metal provides a lower work function so such a device has a lower nVt. Because scavenging metal 304 is thicker than scavenging metal 304A, NVt1 device 220 has lower Vt than NVt2 device 230. However, the trend for PFET devices is the opposite. In other words, the device with thicker scavenging metal has a higher Vt. Accordingly, PVt1 device 250 has higher Vt than PVt2 device 260. In some instances, the lower Vt NFET device and the lower Vt PFET device form the shared gate to provide higher speed CMOS logic devices if they have similar Vt. In some instances, the lower Vt NFET can form the shared gate to have CMOS logic device with higher Vt PFET devices. The same approach applies to higher Vt NFET devices and lower Vt PFET devices. However, device pairs with similar Vt pairs can be used to form the CMOS logic devices.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "similar," "similar to," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor wafer structure comprising a configuration of gate stacks over channel fins, the wafer structure comprising:
   a first channel fin in a substrate;
   a second channel fin in the substrate;
   a gate dielectric over the substrate and the first and second channel fins;
   a first work function metal stack over the gate dielectric; and the first channel fin;
   a second work function metal stack over the gate dielectric and the second channel fin;
   wherein the first work function metal stack comprises a first oxygen scavenger layer positioned between a first cap layer and a barrier layer;
   wherein the second work function metal stack comprises a thinned region of the first oxygen scavenger layer positioned over the barrier layer;
   a third work function metal stack over the first channel fin and the second channel fin to form an updated first work function metal stack over the first channel fin and an updated second work function metal stack over the second channel fin;
   wherein the updated first work function metal stack comprises, the barrier layer, the first oxygen scavenger layer, the first cap layer and the third work function metal stack; and
   wherein the updated second work function metal stack comprises the barrier layer, the thinned region of the first oxygen scavenger layer, and the third work function stack.

2. The structure of claim 1, wherein the first oxygen scavenger layer modulates a work function of the updated first work function metal stack by scavenging oxygen from the gate dielectric.

3. The structure of claim 2, wherein a threshold voltage of the updated first work function metal stack is different than a threshold voltage of the updated second work function metal stack.

4. The structure of claim 1, wherein the barrier layer of the updated first work function metal stack comprises a layer of TiN.

* * * * *